United States Patent [19]

Gat

[11] 4,331,485

[45] May 25, 1982

[54] METHOD FOR HEAT TREATING SEMICONDUCTOR MATERIAL USING HIGH INTENSITY CW LAMPS

[76] Inventor: Arnon Gat, 1875 Newell Rd., Palo Alto, Calif. 94303

[21] Appl. No.: 126,458

[22] Filed: Mar. 3, 1980

[51] Int. Cl.³ .................... H01L 21/26; H01L 21/265
[52] U.S. Cl. ..................... 148/1.5; 148/187; 357/91; 427/53.1; 427/55
[58] Field of Search ............... 148/1.5, 187; 357/91; 427/45.1, 53.1, 55

[56] References Cited

U.S. PATENT DOCUMENTS

| | | | |
|---|---|---|---|
| 4,115,163 | 9/1978 | Gorina | 148/175 |
| 4,151,008 | 4/1979 | Kirkpatrick | 148/1.5 |
| 4,169,740 | 10/1979 | Kalbitzer et al. | 148/1.5 |

OTHER PUBLICATIONS

Cohen et al., Appl. Phys. Letts., 33 (Oct. 1978), 751.
Celler et al., J. Appl. Phys., 50 (1979), 7264.
Bomke et al., Appl. Phys. Letts., 33 (1978), 955.
E G & G Data Sheet, F1008 C-4, DC Krypton Arc Discharge Tube.
Van Gutfeld, IBM Tech. Discl. Bulletin, 19 (1977), 3955.
Gat et al., Appl. Phys. Letts. 33 (1978), 389.

Primary Examiner—Upendra Roy
Attorney, Agent, or Firm—Flehr, Hohbach, Test, Albritton & Herbert

[57] ABSTRACT

Apparatus for annealing semiconductor wafers includes a support for receiving the wafers and resistive heaters for heating the wafers by thermal conduction through the support or by convection. A high intensity arc lamp scans the heated wafers thereby raising the temperature sufficiently for heat treating. The process is simple, rapid, efficient, and does not create damaging thermal stresses in the wafers. The high temperature and short time treatment enables material properties unobtainable with conventional thermal processes.

6 Claims, 3 Drawing Figures

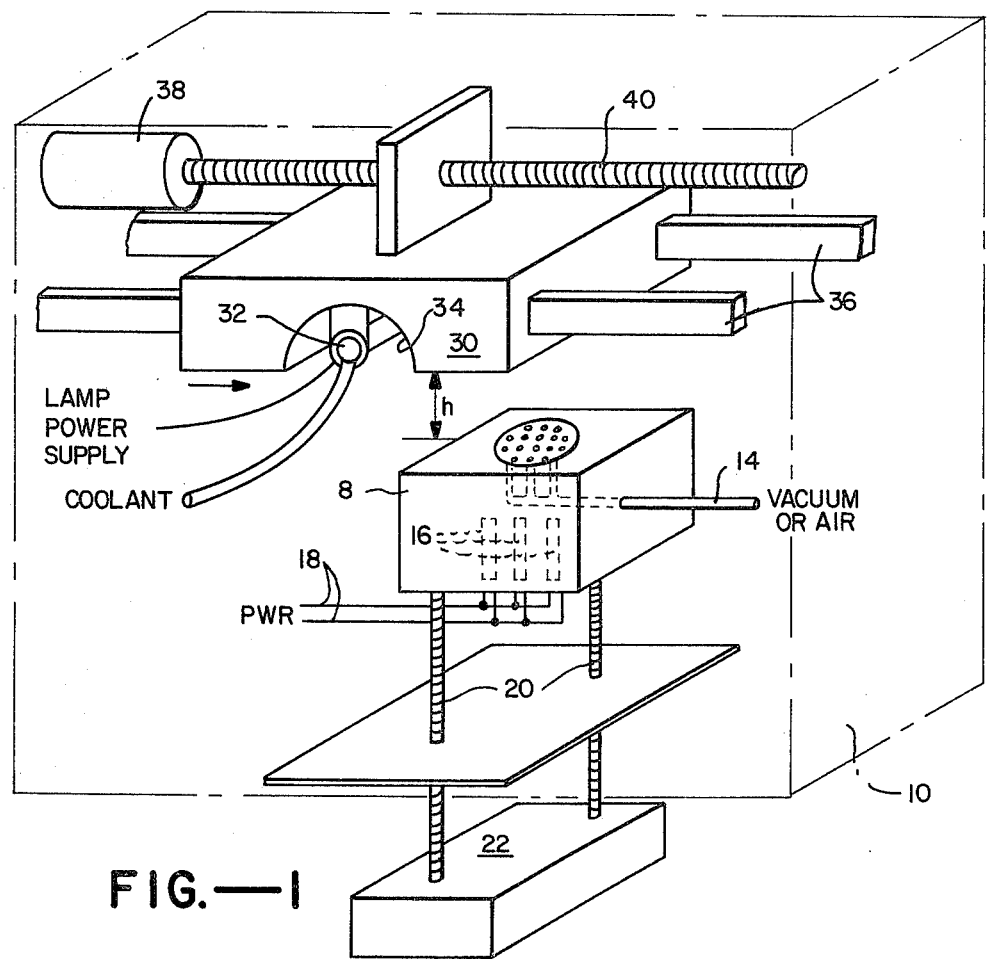
FIG.—1
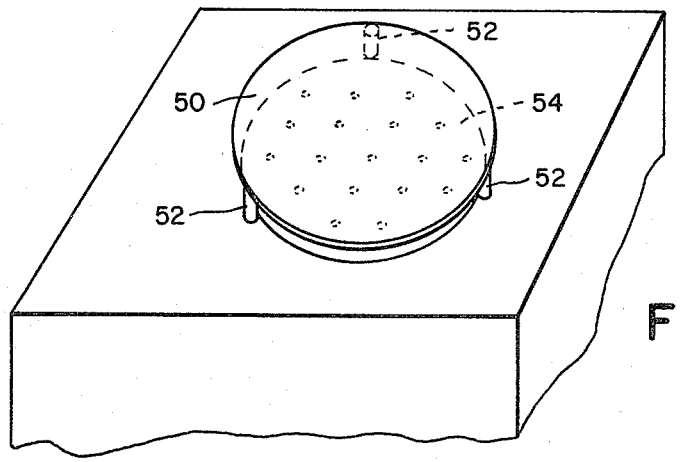
FIG.—2

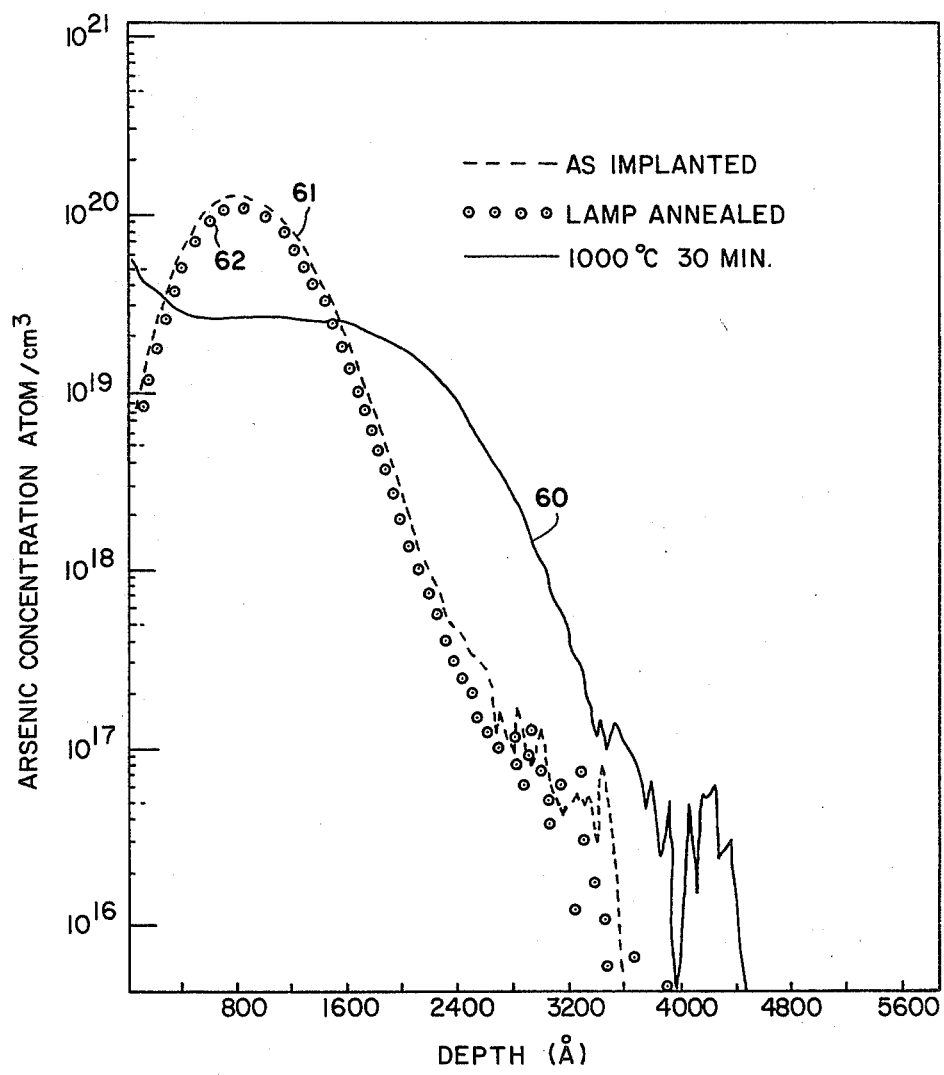
FIG.—3

METHOD FOR HEAT TREATING SEMICONDUCTOR MATERIAL USING HIGH INTENSITY CW LAMPS

This invention relates generally to semiconductor technology, and more particularly the invention relates to heat treating of semiconductor wafers.

Electronic devices are formed in a single crystal semiconductor wafers by the selective introduction of dopant atoms into the lattice structure of the semiconductor material. Group III elements of the periodic table, such as boron and gallium, when diffused or implanted into the semiconductor lattice structure render the semiconductor material P type since these elements are acceptors of electrons in the atomic valence bands of the elements. Group V elements of the period table, such as phosphorous and arsenic, when introduced into the semiconductor lattice structure render the semiconductor material N type since the elements are donors of electrons from the valence bands of the atoms.

The dopant atoms can be introduced into the semiconductor material by diffusion from a dopant atmosphere in a diffusion furnace or by ion implantation in which charged dopant ions are driven into the semiconductor material by a particle accelerator. Particularly in ion implanted semiconductor material lattice defects result and require thermal annealing to properly orient the dopant atoms in the lattice structure.

Additionally, polycrystalline silicon is heat treated by a furnace or by laser scanning and the like to increase crystal grain size and also to activate dopants in the polysilicon.

Heretofore, thermal annealing of semiconductor material has been effected in a furnace with temperature cycled to 700° C.–1100° C. to effect activation of the implanted ions in the semiconductor lattice or to increase grain size in polycrystalline material. This procedure is time consuming and results in a diffusion or migration of the dopant atoms with decreasing performance of the semiconductor product.

More recently, laser annealing has been introduced. Laser annealing allows nearly instantaneous heating and cooling of the semiconductor material with reduced dopant ion migration within the semiconductor lattice structure. However, because of the small beam of the laser, considerable time is necessary for the total scanning of the semiconductor wafer. Moreover, laser equipment is expensive and very inefficient in power usage. Further, laser annealing equipment as well as annealing furnaces require considerable space in the clean room atmosphere of a semiconductor production area.

Thermally assisted flash annealing using high intensity xenon flash lamps has been proposed. However, the short pulses of incoherent light induce a very short temperature rise in the material. To observe any annealing effect, the sample must be heated considerably (approximately 600° C.). Also since the energy discharged into the lamp is limited, only very small areas (e.g. 1 cm × 1 cm) can be annealed. The resultant material was reported to contain defects in a concentration that indicates incomplete annealing. Hot filament ribbons have been proposed. This scheme is intended to be used for the production of silicon which is deposited on a substrate for solar cell usage. In this application it is intended to melt the amorphous silicon with a hot tungsten filament and let this molten silicon cool down and recrystallize. All the apparatus has to be in vacuum to inhibit the oxidation of the hot filament. Because of the vacuum no preheating of the material is proposed and therefore the large gradient between the molten surface of the substrate may include strain and stress in the material.

Accordingly, an object of the present invention is an improved method of heat treating semiconductor material.

Another object of the invention is apparatus for quickly annealing doped and undoped semiconductor material.

Still another object of the invention is apparatus which is relatively simple and inexpensive and which requires little space in a semiconductor manufacturing facility.

Briefly, in accordance with the invention a support is provided for holding a semiconductor wafer for heat treatment. The support includes heater means for heating the wafer to an elevated temperature below the temperature for heat treatment and below a temperature which causes migration of dopant atoms in the semiconductor lattice structure. A high intensity incoherent CW light source is positionable with respect to the support for irradiation of a semiconductor body held on the support. Means can be provided for varying the spacing between the light source and the support, and means is provided for effecting relative motion between the light source and the support whereby the surface of the wafer can be scanned by the light source. Means is provided to control the light intensity by varying the current through the lamp.

Preferably, the high intensity light source comprises a CW arc discharge tube of sufficient length to scan the entire width of a semiconductor body. The support preferably includes a vacuum chuck for holding a semiconductor wafer, and resistive heater means are embedded in the support for heating of the wafer by thermal conduction through the support.

In another embodiment of the invention, the substrate is placed on isolated pins but close to the heater surface. The semiconductor material is heated to the heater temperature. When the lamp is scanning, the wafer is far enough from the heater so that its temperature can rise quickly and independently of the chuck temperature throughout because of heat conduction. This reduces thermal gradients and facilitates the increase in temperature for a given light intensity.

In annealing a semiconductor wafer and the like, the high intensity light source is scanned across the surface of the wafer at a speed determined by the spacing between the light source and wafer and by the particular temperature desired for annealing the semiconductor material and the preheated temperature of the wafer. Thus, a semiconductor wafer can be annealed in a matter of seconds thereby increasing the throughput of annealed semiconductor material and without introducing residual stresses in the annealed wafer and without causing dopant migration. Moreover, polycrystalline silicon is readily recrystallized with increased crystal size.

The invention and objects and features thereof will be more readily apparent from the following detailed description and appended claims when taken with the drawing, in which:

FIG. 1 is a perspective view of one embodiment of apparatus in accordance with the invention.

FIG. 2 is a perspective view of another embodiment of apparatus in accordance with the invention.

FIG. 3 is a plot of dopant concentration of three wafers as implanted after conventional thermal annealing and after processing in accordance with the present invention.

In the drawing, a semiconductor wafer to be annealed is placed on a support pedestal 8 within housing 10 and positioned by means of a chuck 12 through a vacuum line 14. The support 8 is a heat conductive material such as brass with a graphite top plate in which a plurality of resistive heaters 16 are provided with the resistive heaters interconnected with an electrical power source through lines 18. In one embodiment the resistive heaters are CalRods and a sufficient number of heaters are provided whereby the support 8 and a wafer maintained on vacuum chuck 12 can be heated to 500° C. The support 8 is vertically moveable by means of lead screws 20 which are driven by suitable motor driven gear train shown generally at 22. Alternatively, support 8 can be made stationary.

Mounted within housing 10 above pedestal 8 is thermal radiation apparatus 30 including a radiant heater 32. A concave surface 34 reflects radiant energy downwardly onto the semiconductor body. In a preferred embodiment the radiant heater comprises a CW arc discharge tube such as the dc crypton arc discharge tube FK-111C-3 available from EG & G. The tube 32 is of sufficient length to irradiate the entire surface of a semiconductor wafer on a vacuum chuck 12 in a single scan.

The radiant heater apparatus 30 is moveably mounted on a pair of horizontal rails 36 and is driven by means of motor 38 and lead screw 40. Thus, the radiant heater 30 can be moved from one side of the housing assembly 10 to the other side to thereby scan a wafer on pedestal 8. Alternatively, the radiant heater 30 can be fixed and the support 8 moved along rails.

In annealing a semiconductor wafer in accordance with the present invention, the current through the radiant heater 32 is selected along with the linear speed of heater assembly 30 whereby the surface of the semiconductor wafer is heated to sufficient temperature for annealing. Normally, the annealing temperature for silicon semiconductor material will be in the range of 1200°–1400° C. In some applications higher temperatures and melting can be achieved. Importantly, by preheating the semiconductor wafer 12 to a temperature of about 500° C. by means of the resistive heaters 16, excessive thermal stresses in the semiconductor wafer are avoided since the temperature rise provided by the radiant heater 30 need be only 700°–900° C.

In the embodiment of FIG. 2, a semiconductor wafer 50 is supported on a plurality of thermally insulating ceramic posts 52 above the vacuum chuck 54. By reversing the air flow in the chuck, uniform heating of the wafer is facilitated by convection heating. In some cases convection heating is sufficient and reverse air flow is not necessary. Thus, as the lamp is scanned across the wafer surface, temperature can increase throughout the thickness of the wafer and temperature gradients in the wafer are minimized.

FIG. 3 is a plot of dopant concentrations in three identical wafers two of which were annealed by conventional thermal processing and by the scanning process in accordance with the present invention. The dopant profile 60 for the conventionally processed wafer shows considerable dopant migration during annealing as compared to the dopant profile 62 for the scanned wafer. This profile 62 is identical to the as implanted profile 61 meaning that annealing with the present invention does not alter the dopant concentration profile. Prior to annealing all wafers had sheet resistivity of 3100 ohms per square. After conventional annealing, one wafer had sheet resistivity of 150 ohms per square, while the scanned wafer had sheet resistivity of 168 ohms per square. The difference stems from the fact that the thermal annealing profile is more diffused and has slightly higher average mobility. In both cases all the dopants are active and contribute to the electrical conductivity of the crystal.

The annealing or heat treating of semiconductor wafers using the apparatus and method in accordance with the present invention has proved to be advantageous in initial cost of the equipment, limited space required in the semiconductor manufacturing facility, and semiconductor material throughput. Also, steeper and shallower junctions are achieved meaning potentially smaller and faster devices. Also since achievable scanning temperature ranges are higher than furnace temperatures larger poly grain can be grown with the above method. By preheating the semiconductor wafer through the support pedestal prior to the radiation beam scanning, deleterious thermal stresses within the semiconductor wafer are avoided and the light intensity needed to raise the semiconductor temperature is reduced considerably. The resulting annealed wafers are high quality. The invention has heat treating applications other than annealing and including polycrystalline semiconductor regrowth to increase crystal grain size, aluminum sintering and grain growth, phosphorous glass reflow and the like.

Thus, while the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of heat treating a semiconductor body at a high temperature for a short duration comprising the steps of preheating said semiconductor body to a first temperature, and radiating a surface of said semiconductor body with a high intensity CW lamp thereby rapidly heating said radiated surface to a second temperature higher than said first temperature for a short duration of time.

2. The method as defined by claim 1 and further including the step of adjusting the spacing between said semiconductor body and said lamp and the scan speed whereby said semiconductor body is heated to a preselected temperature by said lamp.

3. The method as defined by claim 1 and further including the step of adjusting the power to said lamp whereby said semiconductor body is heated to a preselected temperature by said scanned light source.

4. The method as defined by claim 1 wherein the step of preheating said semiconductor body includes mounting said semiconductor body on a support and heating said support.

5. The method as defined by claim 1 wherein the step of preheating said semiconductor body includes positioning said body in spaced relationship with respect to a top surface of a support pedestal whereby said body is heated by convection.

6. The method as defined by claim 1 wherein said step of radiating a surface includes scanning said surface with said lamp.

* * * * *